US012564865B2

(12) United States Patent
Zhang et al.

(10) Patent No.: US 12,564,865 B2
(45) Date of Patent: Mar. 3, 2026

(54) TECHNOLOGIES FOR ACOUSTOELECTRONIC NANOTWEEZING

(71) Applicant: Duke University, Durham, NC (US)

(72) Inventors: Peiran Zhang, Durham, NC (US); Joseph Rufo, Durham, NC (US); Tony Jun Huang, Durham, NC (US)

(73) Assignee: Duke University, Durham, NC (US)

( * ) Notice: Subject to any disclaimer, the term of this patent is extended or adjusted under 35 U.S.C. 154(b) by 877 days.

(21) Appl. No.: 17/883,883

(22) Filed: Aug. 9, 2022

(65) Prior Publication Data

US 2023/0051277 A1 Feb. 16, 2023

Related U.S. Application Data

(60) Provisional application No. 63/231,361, filed on Aug. 10, 2021.

(51) Int. Cl.
B06B 1/06 (2006.01)
B01L 3/00 (2006.01)
H10N 30/00 (2023.01)

(52) U.S. Cl.
CPC ...... B06B 1/0607 (2013.01); B01L 3/502761 (2013.01); H10N 30/00 (2023.02)

(58) Field of Classification Search
CPC .......... B06B 1/0607; B01L 2400/0436; B01L 2400/0439; B01L 2200/0668; B01L 3/502761; H10N 30/00; G10K 15/00
See application file for complete search history.

(56) References Cited

U.S. PATENT DOCUMENTS 8,425,749 B1 * 4/2013 Ravula ................... B03C 5/026
181/141
8,573,060 B2 11/2013 Huang et al.
(Continued)

FOREIGN PATENT DOCUMENTS

WO 2015134831 A1 9/2015
WO 2015164847 A1 10/2015

OTHER PUBLICATIONS

Lam et al., Multifunctional Single Beam Acoustic Tweezer for Non-Invasive Cell/Organism Manipulation and Tissue Imaging, 6 Scientific Reports 37554, Nov. 22, 2016, 7 pages.
(Continued)

*Primary Examiner* — Emily P Pham
(74) *Attorney, Agent, or Firm* — Barnes & Thornburg LLP

(57) ABSTRACT

Technologies for acoustoelectronic manipulation of micro/nano particles include a system having a piezoelectric substrate coupled to one or more acoustic transducers and a fluid layer positioned above the substrate. Micro/nano particles are introduced to the fluid, which can be in the form of a droplet or in a confined channel, and a signal is applied to the acoustic transducer. One or more parameters of the signal are varied after introducing the micro/nano particles into the fluid. The parameters may include amplitude, frequency, or phase of the signal. The system may include one or more acoustic transducers. Multiple signals may be applied to the acoustic transducers. Wave superposition of acoustic waves in the substrate manipulates micro/nano particles in the fluid. The nanoparticles may include carbon nanotubes, nanowires, nanofibers, graphene flakes, quantum dots, SERS probes, exosomes, vesicles, DNA, RNA, antibodies, antigens, macromolecules, or proteins.

20 Claims, 9 Drawing Sheets

(56)　　　　　　References Cited

U.S. PATENT DOCUMENTS

| | | | |
|---|---|---|---|
| 9,821,310 B2 | 11/2017 | Oytun et al. | |
| 9,895,699 B2 | 2/2018 | Short et al. | |
| 10,350,613 B2 | 7/2019 | Walti et al. | |
| 10,598,575 B2 * | 3/2020 | Zheng | G01N 1/4077 |
| 10,603,685 B2 | 3/2020 | Zheng et al. | |
| 10,724,029 B2 * | 7/2020 | Lipkens | C12M 47/02 |
| 2008/0315175 A1 | 12/2008 | Pauzauskie et al. | |
| 2013/0192958 A1 * | 8/2013 | Ding | B07C 5/3427 |
| | | | 198/630 |
| 2014/0008307 A1 * | 1/2014 | Guldiken | B01L 3/502761 |
| | | | 422/502 |
| 2017/0292934 A1 * | 10/2017 | Azpiroz | G01N 27/44704 |
| 2019/0031999 A1 | 1/2019 | Suresh et al. | |
| 2020/0276579 A1 | 9/2020 | Huang et al. | |

OTHER PUBLICATIONS

Lin et al., Opto-Thermoelectric Nanotweezers, 12 Nature photonics 195, Apr. 2018, 10 pages.
Ozcelik et al., Acoustic tweezers for the life sciences, 15 Nature Methods 1021, Dec. 2018, 19 pages.
Smith et al., Rapid Cell Separation With Minimal Manipulation for Autologous Cell Therapies, 7 Scientific Reports 41872, Feb. 2, 2017, 15 pages.
Sundvik et al., Effects of Acoustic Levitation on the Development of Zebrafish, *Danio rerio*, Embryos, 5 Scientific Reports 13596, Sep. 4, 2015, 11 pages.
Zhang et al., Acoustoelectronic Nanotweezers Enable Dynamic and Large-Scale Control of Nanomaterials, 12 Nature Communications 3844, Jun. 22, 2021, 10 pages.

* cited by examiner

TECHNOLOGIES FOR ACOUSTOELECTRONIC NANOTWEEZING

CROSS-REFERENCE TO RELATED APPLICATIONS

This application claims the benefit of and priority to U.S. Patent Application No. 63/231,361, entitled "ACOUSTO-ELECTRONIC NANOTWEEZERS," which was filed on Aug. 10, 2021, and which is incorporated herein by reference in its entirety.

STATEMENT REGARDING FEDERALLY SPONSORED RESEARCH

This invention was made with Government support under Federal Grant Nos. R01GM132603, R01GM135486, UG3TR002978, U18TR003778, R33CA223908, and R01GM127714, awarded by the National Institutes of Health, and under Federal Grant No. ECCS-1807601 awarded by the National Science Foundation. The Government has certain rights in this invention.

BACKGROUND

The ability to precisely manipulate nano-objects on a large scale can enable the fabrication of materials and devices with tunable optical, electromagnetic, and mechanical properties. Conventional optical tweezers have the ability to perform nanoscale manipulation with high spatial resolution and single-particle maneuverability but require high optical field intensities (e.g., 100-1000 kW/mm$^2$) which may lead to undesired heating, damage to biological specimens, and other adverse effects. Optoelectronic tweezers combine light-induced dielectrophoresis with local convective vortices (light-induced AC electroosmosis) to achieve nanoscale trapping with lower field intensity, but the local convective vortices are unfavorable for label-free, deterministic manipulation.

Typical acoustic tweezers use acoustic radiation forces to trap particles in acoustic pressure nodes or antinodes. However, acoustic approaches are typically constrained by acoustic streaming, which is an inherent phenomenon that arises from wave propagation and can counteract the acoustic radiation forces. Additionally, acoustic radiation forces diminish quickly as particle diameter scales below 100 nm.

SUMMARY

According to one aspect of the disclosure, a method for acoustoelectronic manipulation of nanoparticles comprises introducing nanoparticles into a fluid layer, positioned over a first surface of a piezoelectric substrate; applying a first signal to a first acoustic transducer set, wherein the first acoustic transducer set is coupled to the first surface of the piezoelectric substrate and spaced apart from the fluid layer; and varying a parameter of the first signal after introducing the nanoparticles into the fluid layer. In an embodiment, applying the first signal to the first acoustic transducer set comprises creating a standing acoustic wave in the piezoelectric substrate. In an embodiment, the standing wave is in-plane relative to the first surface of the piezoelectric substrate. In an embodiment, the first piezoelectric substrate comprises a y-cut, 41 degrees rotated lithium niobate crystal. In an embodiment, the first signal comprises an alternating current signal having a frequency of about 38.44 MHz.

In an embodiment, varying the parameter of the first signal comprises varying an amplitude, a frequency, or a phase of the first signal. In an embodiment, varying the parameter of the first signal comprises activating or deactivating the first signal.

In an embodiment, the method further comprises applying a second signal to a second acoustic transducer set, wherein the second acoustic transducer set is coupled to the first surface of the piezoelectric substrate and spaced apart from the fluid layer, and wherein the second acoustic transducer set is oriented orthogonally to the first acoustic transducer set. In an embodiment, the first signal and the second signal have a first frequency. In an embodiment, the first signal has a first frequency and the second signal has a second frequency, wherein the first frequency and the second frequency differ by a small amount.

In an embodiment, the method further includes varying a second parameter of the second signal after introducing the nanoparticles into the fluid layer. In an embodiment, varying the parameter of the first signal comprises varying a first phase of the first signal; and varying the second parameter of the second signal comprises varying a second phase of the second signal, wherein the first signal and the second signal have a first frequency. In an embodiment, varying the parameter of the first signal comprises varying a first amplitude of the first signal; and varying the second parameter of the second signal comprises varying a second amplitude of the second signal. In an embodiment, the first signal and the second signal have a first frequency.

In an embodiment, the nanoparticles have a size of about 400 nm or less. In an embodiment, the nanoparticles have a size of about 100 nm or less. In an embodiment, the nanoparticles have a size between about 1 nm to 100 nm. In an embodiment, the nanoparticles comprise carbon nanotubes, nanowires, nanofibers, graphene flakes, quantum dots, SERS probes, exosomes, vesicles, DNA, RNA, antibodies, antigens, macromolecule, or proteins.

In an embodiment, the method further comprises electrically shielding part of the piezoelectric substrate while applying the signal to the first acoustic transducer set. In an embodiment, the method further comprises transferring the nanoparticles to a macroscopic surface after applying the first signal. In an embodiment, the fluid layer is positioned in a confined microchannel positioned over the first surface of the piezoelectric substrate.

According to another aspect, a system for acoustoelectronic manipulation of nanoparticles includes a piezoelectric substrate having a first surface; a first acoustic transducer set coupled to the first surface of the piezoelectric substrate; a fluid layer positioned over the first surface of the piezoelectric substrate; and a controller. The fluid layer is spaced apart from the acoustic transducer set on the first surface. The controller is configured to apply a first signal to a first acoustic transducer set and vary a parameter of the first signal after introduction of nanoparticles into the fluid layer. In an embodiment, to apply the first signal to the first acoustic transducer set comprises to create a standing acoustic wave in the piezoelectric substrate. In an embodiment, the standing wave is in-plane relative to the first surface of the piezoelectric substrate. In an embodiment, the first piezoelectric substrate comprises a y-cut, 41 degrees rotated lithium niobate crystal. In an embodiment, the first signal comprises an alternating current signal having a frequency of about 38.44 MHz.

In an embodiment, to vary the parameter of the first signal comprises to vary an amplitude, a frequency, or a phase of the first signal. In an embodiment, to vary the parameter of the first signal comprises to activate or deactivate the first signal.

In an embodiment, the system further comprises a second acoustic transducer set coupled to the first surface of the piezoelectric substrate and spaced apart from the fluid layer. The second acoustic transducer set is oriented orthogonally to the first acoustic transducer set or tilted at a predetermined angle relative to the first acoustic transducer set. The controller is further to apply a second signal to the second acoustic transducer set. In an embodiment, the first signal and the second signal have a first frequency. In an embodiment, the first signal has a first frequency and the second signal has a second frequency, wherein the first frequency and the second frequency differ by a small amount.

In an embodiment, the controller is further configured to vary a second parameter of the second signal after the introduction of the nanoparticles into the fluid layer. In an embodiment, to vary the parameter of the first signal comprises to vary a first phase of the first signal; and to vary the second parameter of the second signal comprises to vary a second phase of the second signal, wherein the first signal and the second signal have a first frequency. In an embodiment, to vary the parameter of the first signal comprises to vary a first amplitude of the first signal; and to vary the second parameter of the second signal comprises to vary a second amplitude of the second signal. In an embodiment, the first signal and the second signal have a first frequency.

In an embodiment, the nanoparticles have a size of about 400 nm or less. In an embodiment, the nanoparticles have a size of about 100 nm or less. In an embodiment, the nanoparticles have a size between about 1 nm to 100 nm. In an embodiment, the nanoparticles comprise carbon nanotubes, nanowires, nanofibers, graphene flakes, quantum dots, SERS probes, exosomes, vesicles, DNA, RNA, antibodies, antigens, macromolecule, or proteins.

In an embodiment, part of the piezoelectric substrate is electrically shielded during application of the signal to the first acoustic transducer set. In an embodiment, the nanoparticles are transferred to a macroscopic surface after application of the first signal. In an embodiment, the system further comprises a confined microchannel positioned over the first surface of the piezoelectric substrate, wherein the fluid layer is positioned in the confined microchannel.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
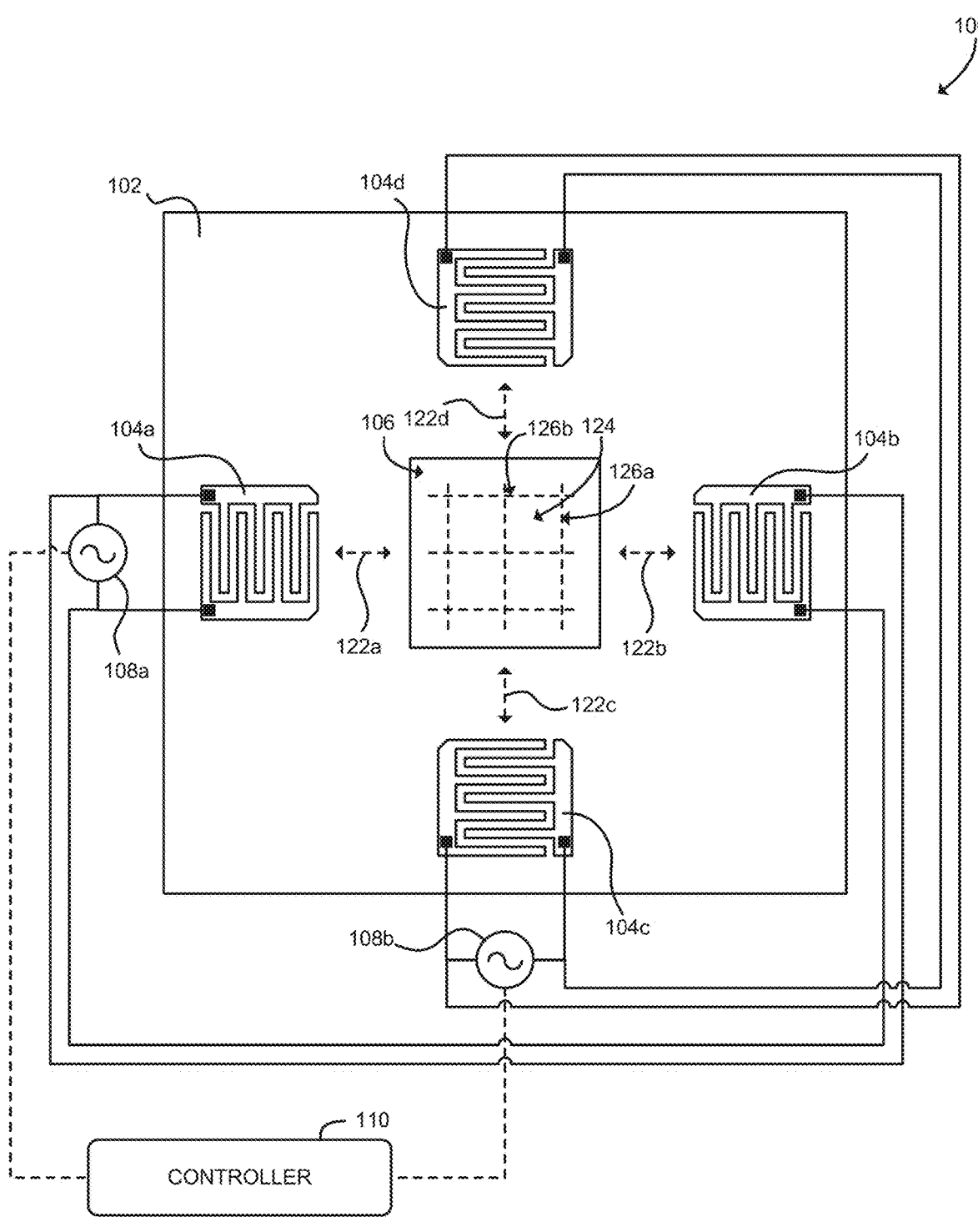
FIG. 1 is a schematic view of at least one embodiment of a system for acoustoelectronic tweezing.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); or (A, B, and C). Similarly, items listed in the form of "at least one of A, B, or C" can mean (A); (B); (C): (A and B); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Figure 2:
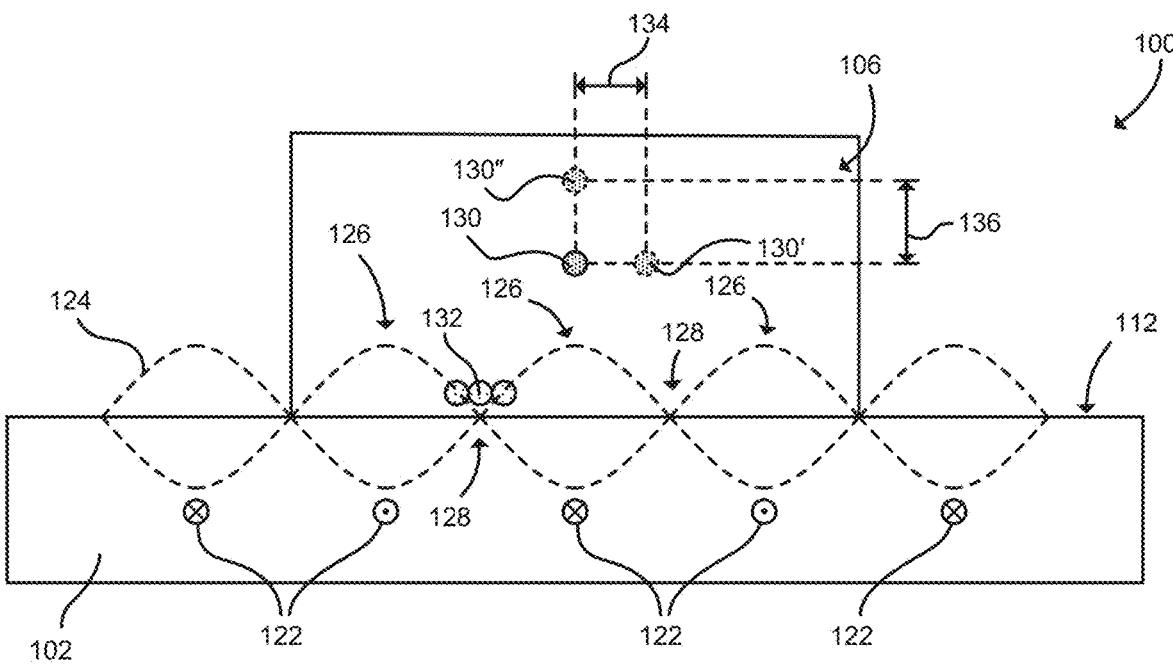
FIG. 2 is a schematic side view of a system of FIG. 1 performing dynamic manipulation of nanoparticles.

Referring now to FIGS. 1 and 2, an illustrative system 100 for acoustoelectronic nanotweezing includes a piezoelectric substrate 102 coupled to multiple interdigital transducers 104. A fluid layer 106 is positioned over the substrate 102 and between the transducers 104. In use, and as described further below, a fluid including nanoparticles is introduced to the fluid layer 106, and one or more signals are applied to the transducers 104. The transducers generate acoustic waves in the piezoelectric substrate 102, which propagate underneath the fluid layer 106. Those acoustic waves cause the piezoelectric substrate 102 to generate a varying electrical field, which exerts forces on the nanoparticles within the fluid layer 106. The signals applied to the transducers 104 may be dynamically varied in order to dynamically manipulate the nanoparticles. The system 100 may achieve relatively large actuation forces (e.g., on the order of fN-pN) on nanoparticles without introducing significant hydrodynamic disturbances. Accordingly, the system 100 enables dynamic manipulation of nanoparticles with low field intensity that is biocompatible. Additionally, low acoustic streaming enables effective manipulation of nano-scale objects that is not possible with existing acoustic tweezing. In use, the system 100 enables precise, versatile, and dynamic manipulation of nano-objects on a macroscopic scale, and can be applied to the bottom-up design and creation of nanotextures and materials with highly tunable properties. The system 100 has been demonstrated to provide spatiotemporal control of complex patterns of nanomaterials across a large wave-interfering region. By varying the tonal parameters (e.g., frequency, phase, time, and amplitude), diverse nanomanipulation functions, including transportation, concentration, orientation, pattern-overlaying, and sorting, have been achieved using a simple device configuration.

In the illustrated embodiment shown in FIG. 1, the system 100 includes the piezoelectric substrate 102, which is illustratively formed from a single-crystal piezoelectric material. As described further below, the material selected for the piezoelectric substrate 102 provides high acoustoelectric efficiency with relatively low acoustic streaming. The fluid layer 106 is formed on the piezoelectric substrate 102. The fluid layer 106 may be embodied as a liquid droplet, a fluid contained in a confined channel such as a microchannel or nanochannel, or other fluid layer positioned on the piezoelectric substrate 102.

As shown, the system 100 includes four interdigital transducers (IDTs) 104a through 104d. In particular, the system 100 includes a pair of opposed IDTs 104a, 104b and another pair of opposed IDTs 104c, 104d that are positioned orthogonal to the IDTs 104, 104b. The illustrative IDTs 104 may be formed through photolithographic deposition of interdigital electrodes on the substrate 102. As described further below, application of an electrical signal to each IDT 104 generates surface acoustic waves in the piezoelectric substrate 102 through the piezoelectric effect. Although illustrated as including four IDTs 104a through 104d, it should be understood that in other embodiments the system 100 may include a different number of IDTs 104, such as a single IDT 104 or two IDTs 104. Each of the pairs of IDTs 104a, 104b and 104c, 104d may operate as an acoustic transducer set, which is a collection of one or more acoustic transducers for generating acoustoelectronic waves. Additionally, although the pairs of IDTs 104a, 104b and 104c, 104d are illustrated as being orthogonal to each other, it should be understood that in other embodiments the IDTs 104 may be positioned at a different angle relative to each other (e.g., between 0 and 179 degrees). Additionally or alternatively, although illustrated as IDTs 104, it should be understood that in other embodiments, the system 100 may include any other acoustic transducer 104 capable of generating acoustic waves in the piezoelectric substrate 102.

Each of the IDTs 104 is coupled to a signal source 108, which may be embodied as a function generator, an oscillator, an amplifier, a variable-frequency signal generator, a digital-to-analog (D/A) converter, or any other signal source capable of generating a varying electrical signal. Illustratively, a signal source 108a is coupled to the pair of IDTs 104a, 104b, and another signal source 108b is coupled to the pair of IDTs 104c, 104d. In the illustrative embodiment, the electrodes of each pair of IDTs 104a, 104b and 104c, 104d are coupled to the respective signal sources 108a, 108b such that electrodes of the same polarity relative to the signal source 108 are positioned opposite each other (i.e., connected in a cis- configuration). In some embodiments, the electrodes of each pair of IDTs 104a, 104b and 104c, 104d are coupled to the respective signal sources 108a, 108b in a trans-configuration; that is, the polarity of the respective signal source 108a, 108b may be reversed between the pairs of IDTs 104a, 104b and 104c, 104d.

The signal sources 108 are coupled to a controller 110, which may be embodied as a microcontroller, a digital signal processor, a programmable logic unit, a computer, or any other control circuit capable of controlling operations of the signal sources 108. For example, the controller 110 may be capable of controlling one or more parameters of each signal source 108, such as amplitude (i.e., voltage), frequency, phase, on/off time, or other parameters. To do so, the controller 110 may include a number of electronic components commonly associated with units utilized in the control of electronic and electromechanical systems. For example, the controller 110 may include, amongst other components customarily included in such devices, a processor and a memory device. The processor may be any type of device capable of executing software or firmware, such as a microcontroller, microprocessor, digital signal processor, or the like. The memory device may be embodied as one or more non-transitory, machine-readable media. The memory device is provided to store, amongst other things, instructions in the form of, for example, a software routine (or routines) which, when executed by the processor, allows the controller 110 to dynamically control parameters of the signal sources 108 using the other components of the system 100. In some embodiments, the controller 110 may also include an analog interface circuit, which may be embodied as any electrical circuit(s), component, or collection of components capable of performing the functions described herein. The analog interface circuit may, for example, convert signals from the processor into output signals which are suitable for controlling the signal sources 108. It is contemplated that, in some embodiments, the signal sources 108 (or portions thereof) may be integrated into the controller 110.

In use, the electrical signals applied by the sources 108 to the IDTs 104 generate acoustic waves 122 that propagate through the piezoelectric substrate 102. Illustratively, the opposing IDTs 104a, 104b generate opposing acoustic waves 122a, 122b, which may be superimposed to generate a standing acoustic wave in the substrate 102. Similarly, the opposing IDTs 104c, 104d generate opposing acoustic waves 122c, 122d, which also may be superimposed to generate a standing acoustic wave. The acoustic waves 122a, 122b are orthogonal to the acoustic waves 122c, 122d. Superposition of the acoustic waves 122a through 122d may be dynamically controlled to manipulate nanoparticles as described further below.

As shown in FIG. 2, the acoustic waves 122 are in-plane with a surface 112 of the piezoelectric substrate 102. That is, the acoustic waves 122 may be embodied as transverse waves that vibrate parallel to the surface 112, which may reduce coupling with the media positioned in the fluid layer 106 above the surface 112. The vibrations caused by the acoustic waves 122 in the piezoelectric substrate 102 further create a varying electric field 124 above the surface 112 based on the piezoelectric effect. The acoustic wave 122 is a standing wave, and thus the varying electric field 124 has its largest variation over displacement antinodes (DAs) 126 and its smallest variation over displacement nodes (DNs) 128.

Illustratively, nanoparticles 130, 132 may be introduced into the medium contained within the fluid layer 106. The nanoparticles 130, 132 may be embodied as nanoscale particles, filaments, fibers, or other objects having a size (e.g., average diameter or other size) below about 400 nm, below 100 nm, between 1 nm and 100 nm, or otherwise at nanoscale. For example, the nanoparticles 130, 132 may include, without limitation, carbon nanotubes, nanowires, nanofibers, graphene flakes, quantum dots, surface-enhanced Raman scattering (SERS) probes, exosomes, vesicles, DNA, proteins, or other organic or non-organic nanoparticles. The varying electric field 124 exerts electrical forces on those nanoparticles 130, 132, which causes the particles to move toward the antinodes 126 and the nodes 128, respectively. In particular, the nanoparticles 130 have a polarizability that is less than the polarizability of the medium and are attracted to the antinodes 126. Conversely, the nanoparticles 132 have a polarizability that is more than the polarizability of the medium and are attracted to the nodes 128.

Dynamically manipulating parameters of the acoustic wave 122 allows for dynamic manipulation of the nanoparticles 130, 132. For example, changing the phase of the acoustic wave 122 moves the positions of the antinodes 126 by a horizontal distance 134, which in turn moves the illustrative nanoparticle 130 by the horizontal distance 134 to the new position 130'. As another example, increasing the amplitude of the acoustic wave 122 also increases the amplitude of the varying electric field 124, which in turn moves the illustrative nanoparticle 130 by a vertical distance 136 to a new position 130". Additional dynamic manipulations of nanoparticles 130, 132 that may be performed using the system 100 are described below in connection with FIGS. 4 and 6-14.

Figure 3:
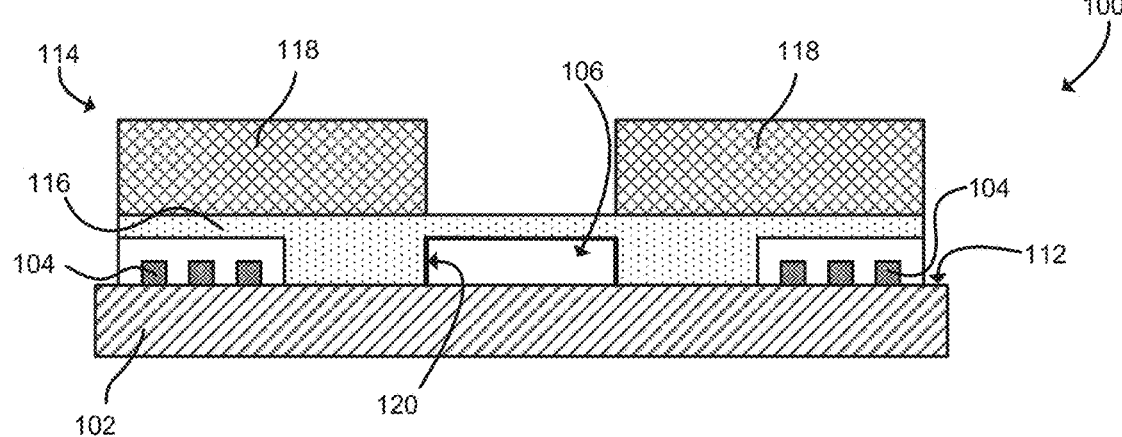
FIG. 3 is a cross-sectional view of one embodiment of a system for acoustoelectronic tweezing.

Referring now to FIG. 3, an illustrative embodiment of the system 100 is shown in cross-section. The piezoelectric substrate 102 is formed from y-cut, 41 degrees rotated lithium niobate (Y-41° LiNbO₃), single side polished, and having a thickness of 0.5 mm. In other embodiments, the piezoelectric substrate 102 may be formed from another suitable piezoelectric material, such as Y-36° LiTaO₃, Y-64° LiNbO₃, thin Y-41° LiNbO₃ rotated 45° about the x-axis of the crystal, or other suitable materials.

The IDTs 104 are formed on the surface 112 of the substrate 112. Illustratively, the IDTs 104 are metallic, including a 5 nm Cr adhesion layer and a 200 nm Au layer. In one embodiment, the system 100 further includes a polymeric cover 114 positioned over the substrate 102 and the IDTs 104. The cover 114 includes a hard polydimethylsiloxane (PDMS) film 116 coupled to substrate 102. The hard PDMS film 116 includes a cavity that defines the fluid layer 106. The illustrative fluid layer 106 is a confined microchannel having a height of about 10 μm or 25 μm. The cover 114 further includes a PDMS cover 118 formed on the hard PDMS film 116. The PDMS cover 118 includes a hole over the fluid layer 106, which may allow imaging or other access of the fluid layer 106 through the hard PDMS film 116. The hard PDMS film 116 may have a thin ceiling (i.e., <500 μm), and the window in the PDMS cover 118 over the channel 106 may have a height of 50 μm to avoid collapse of the PDMS 118. A pluronic coating 120 is applied to the hard PDMS film 116 within the fluid layer 106, which may reduce adhesion to the walls of the cover 114.

In one embodiment, to manufacture the system 100 shown in FIG. 3, an SU-8 photoresist mold is deposited on a silicon wafer using photolithographic techniques. The hard PDMS cover 118 is spin coated over the mold and the wafer. The holed PDMS cover 118 is plasma bonded onto the hard PDMS cover 116. The polymeric cover 114 (including the hard PDMS film 116 and the PDMS cover 118) is peeled off and punched from the wafer. The IDTs 104 are deposited on the substrate 102 using photolithographic techniques. The polymeric cover 114 is bonded to the substrate 102 after deposition of the IDTs 104. The pluronic coating 120 is applied to the inner walls of the hard PDMS cover 116 that define the fluid layer 106. The IDTs 104 may be bonded to wires using silver epoxy.

Figure 4:
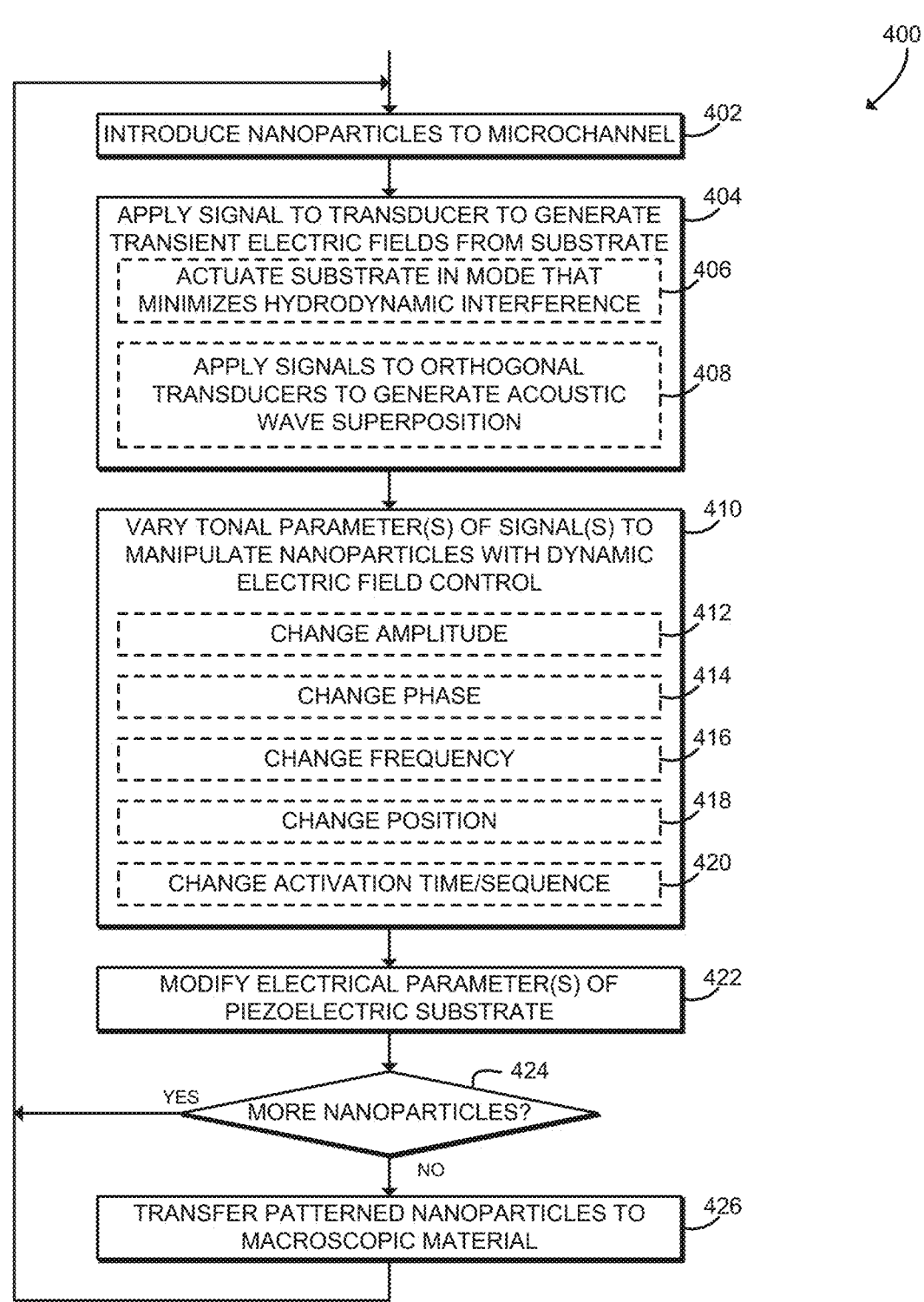
FIG. 4 is a simplified flow diagram of at least one embodiment of a method for dynamically manipulating nanoparticles that may be executed with any of the systems of FIGS. 1-3.

Referring now to FIG. 4, in use, the system 100 may execute a method 400 for acoustoelectronic manipulation of nanoparticles. It should be appreciated that, in some embodiments, one or more operations of the method 400 may be performed by the controller 110 and/or by other components of the system 100 as shown in FIG. 1. The method 400 beings with block 402, in which nanoparticles are introduced to the fluid layer 106 of the system 100. The nanoparticles may be embodied as nano-scale particles or colloids suspended in a fluid medium. In some embodiments the nanoparticles may have a size (e.g., an average diameter) below 400 nm, or below 100 nm, or between 1 nm and 100 nm. For example, the nanoparticles may be embodied as carbon nanotubes, nanowires, nanofibers, graphene flakes, quantum dots, SERS probes, exosomes, vesicles, DNA, proteins, or other nanoparticles. Although described as manipulating nanoparticles, it should be understood that in some embodiments the system 100 may manipulate micro- or nanoparticles, for example, particles having a size (e.g., average diameter) between 1 nm and 10,000 nm.

In block 404, the controller 110 causes a voltage source 108 to apply an electrical signal to one or more transducers 104. The electrical signal causes the transducers 104 to generate acoustic waves in the piezoelectric substrate 102. These acoustic waves in turn generate transient electric fields from the piezoelectric substrate 102 into the fluid layer 106.

In some embodiments, in block 406 the transducers 104 are actuated in a mode that minimizes hydrodynamic interference in the fluid layer 106, for example by minimizing acoustic streaming. For example, the transducer 104 may be operated in a particular frequency range that generates acoustic waves in the piezoelectric substrate 102 that are in-plane with the piezoelectric substrate 102. That is, the acoustic waves have no normal component (or a small normal component) relative to the surface 112 of the piezoelectric substrate 102, which reduces coupling with the fluid layer 106. Particular combinations of piezoelectric substrate 102 materials and signal frequency that provide minimal acoustic streaming may be selected based on experimentation.

Figure 5:
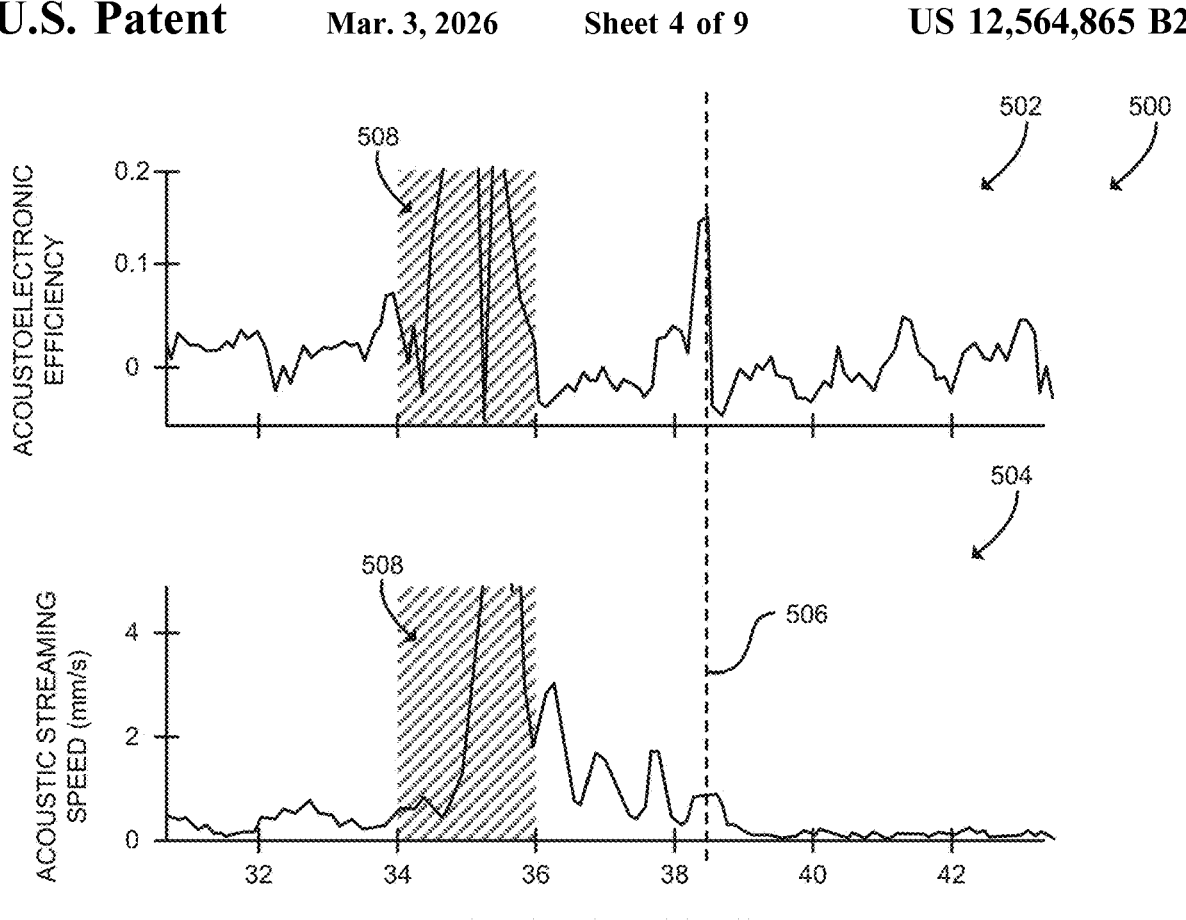
FIG. 5 is a simplified chart illustrating acoustoelectronic efficiency and resulting acoustic streaming for a piezoelectric substrate that may be used with any of the systems of FIGS. 1-3.

Referring now to FIG. 5, diagram 500 illustrates results of an experiment that was performed to select materials for the piezoelectric substrate 102 and associated operating frequencies. In the experiment, a device similar to the system 100 was constructed with a piezoelectric substrate 102 formed from y-cut, 41 degrees rotated lithium niobate (LiNbO$_3$) crystal. A signal was applied to the transducer 104 and surface electric potential on the piezoelectric substrate 102 was measured in a standing wave configuration across a range of frequencies. Chart 502 illustrates acoustoelectronic efficiency (k$_{AET}$) versus excitation frequency (MHz) for this experiment. Acoustoelectronic efficiency (k$_{AET}$) is the ratio of the measured surface electric potential (volts peak-to-peak) to the voltage of the signal applied to the transducer 104 (volts peak-to-peak). Higher values of k$_{AET}$ indicate the ability to enable more efficient electrical manipulation of nanoparticles using the system 100. In another experiment, a signal was applied to the transducer 104 in a continuous traveling wave regime across a range of frequencies, and streaming speed (u$_{fluid}$) of particles suspended in a fluid over the piezoelectric substrate 102 were measured using particle image velocimetry. Chart 504 illustrates streaming speed (u$_{fluid}$) versus excitation frequency (MHz) for this experiment. Higher values of u$_{fluid}$ indicate higher leaked acoustic energy and higher hydrodynamic disturbances, which tend to reduce stability of manipulation capabilities for the system 100. Excitation frequency 506 indicates an operating frequency for which relatively high acoustoelectronic efficiency may be achieved with relatively low potential for acoustic streaming. For the illustrative material (Y-41° LiNbO$_3$), the frequency 506 is 38.44 MHz for 120-μm-wavelength acoustoelectronic waves. The charts 502, 504 also include shaded regions 508, which are abnormal and non-consistent response regions, and which were excluded from consideration for determining the operating frequency 506. The operating frequencies for acoustoelectronic tweezers may be between 10-100 MHz depending on the designed wavelengths of acoustoelectronic waves to be applied.

Similar experiments were performed for additional piezoelectric materials in order to identify suitable materials for the piezoelectric substrate 102. Excitation conditions for piezoelectric materials were identified having the highest k$_{AET}$ and the lowest u$_{fluid}$ for robust nanomanipulation. In particular, suitable excitation conditions were identified as those having measured k$_{AET}$ above 0.06 and measured u$_{fluid}$ below 1.25 mm/s. Certain selected materials for the piezoelectric substrate are described in Table 1, below. Table 1 lists each material with surface finish (e.g., all single side polished (SSP)) and thickness, together with wave propagation direction and selected operating frequency. The experimental results listed in Table 1 are illustrative, and other materials and/or frequencies may be used with the system 100. Additionally, other materials were identified that did not perform as well for acoustoelectronic manipulation. For example, Y-128° LiNbO$_3$, which is typically used for surface acoustic wave (SAW) generation for acoustic tweezing operations, had relatively low measured k$_{AET}$ (at about 0.05) combined with very high u$_{fluid}$ (about 140 mm/s). As another example, Y-42° LiTaO$_3$, which has been used for shear-horizontal wave applications, had relatively low u$_{fluid}$ (about 0.2 mm/s) but also had relatively low k$_{AET}$ (below 0.06). Silica, which is not piezoelectric, was used as a negative control and had measured values of k$_{AET}$ and u$_{fluid}$ near zero.

TABLE 1

| Piezoelectric materials and operating frequencies. | | |
|---|---|---|
| Piezoelectric Material | Wave Direction | Frequency (MHz) |
| Y-41° LiNbO$_3$, SSP, 0.5 mm | X-axis of crystal | 38.44 |
| Y-36° LiTaO$_3$, SSP, 0.5 mm | X-axis of crystal | 34.48 |
| Y-41° LiNbO$_3$, SSP, 0.5 mm | 45°-rotated X-axis of crystal | 40.87 |
| Y-41° LiNbO$_3$, SSP, 0.18 mm | X-axis of crystal | 38.44 |
| Y-64° LiNbO$_3$, SSP, 0.5 mm | X-axis of crystal | 37.95 |
| Y-41° LiNbO$_3$, SSP, 0.18 mm | 45°-rotated X-axis of crystal | 39.33 |

Referring back to FIG. 4, in some embodiments, in block 408, the controller 110 causes a voltage source 108 to apply multiple electrical signals to multiple orthogonal transducers 104. For example, in the illustrative embodiment shown in FIG. 1, the controller 110 may apply a signal to the transducers 104a, 104b and the controller 110 may apply another signal to the transducers 104c, 104d, which are orthogonal to the transducers 104a, 104b. The acoustic waves generated by the orthogonal transducers are superimposed on the piezoelectric substrate 102, which may generate interference patterns or other wave superposition effects as described further below.

In block 410, the controller 110 varies one or more tonal parameters of the signal or signals applied to the transducers 104. Varying the tonal parameters allows the system 100 to manipulate nanoparticles using dynamic electric field control. In some embodiments, in block 412 the controller 110 may change the amplitude of one or more signals. For example, changing the amplitude may change the height 136 of a nanoparticle 130 within the fluid layer 106 as shown in FIG. 2 and described above. As another example, changing the amplitude for one or more acoustic waves may modify acoustic wave superposition as discussed below in connection with FIG. 10. In some embodiments, in block 414 the controller 110 may change the phase of one or more signals. For example, changing the phase may change the horizontal position 134 of a nanoparticle 130, 132 as shown in FIG. 2 and described above. Additional examples illustrating varying the phase of one or more signals are described below in connection with FIGS. 11-12. In some embodiments, in block 416 the controller 110 may change the frequency of one or more signals. Changing the frequency may, for example, adjust the position of one or more displacement antinodes 126 and/or displacement nodes 128 and thus may change the position of one or more nanoparticles. Additional examples illustrating changes in frequency are described below in connection with FIGS. 7-9. In some embodiments, in block 418 the controller 110 may change the wave position of one or more signals. For example, a standing acoustoelectronic wave can be confined into a narrow beam by reducing the aperture of the IDTs 104. In some embodiments, in block 420 the controller 110 may change the activation time and/or sequence of one or more signals. For example, nanoparticles may be initially randomly distributed within the fluid layer 106 and then may be aligned along one or more standing acoustoelectronic waves when the associated signals are activated. As another example, pulsed signals may be temporally modulated to selectively create local patterns.

In block 422, in some embodiments one or more electrical parameters of the piezoelectric substrate 102 may be modified. For example, the piezoelectric substrate 102 may be selectively electrically shielded in order to generate patterns of nanoparticles on the substrate 102. One example of patterned nanoparticles generated with selective shielding of the piezoelectric substrate 102 is described below in connection with FIG. 14.

In block 424, it is determined whether to introduce additional nanoparticles to the fluid layer 106 for further manipulation. For example, in some embodiments nanotextures or other structures may be manufactured using multiple types of nanoparticles and/or using multiple nanoparticle manipulation steps. One example of complex manipulation of multiple nanoparticles is described below in connection with FIG. 11. Referring again to block 424, if it is determined to introduce additional nanoparticles, the method 400 loops back to block 402 in which additional nanoparticles are introduced to the fluid layer 106. If not, the method 400 advances to block 426.

In block 426, in some embodiments, patterned nanoparticles that have been manipulated by the device 100 may be transferred to a macroscopic material. For example, after patterning, the nanoparticles may subsequently be transferred to films of polydimethylsiloxane (PDMS), hydrogel (e.g., polyethylene-glycol-based hydrogels), UV-epoxy upon polymerization, or other materials. The patterned nanoparticles may extend across the active piezoelectric substrate between the IDTs 104 over macroscopic distances, such as cm or other macroscopic size. Thus, the system 100 may generate nanopatterned or nanotextured objects on a macroscopic scale (e.g., centimeter scale). After manipulating the nanoparticles, the method 400 loops back to block 402, in which additional nanoparticles may be manipulated.

Figure 6:
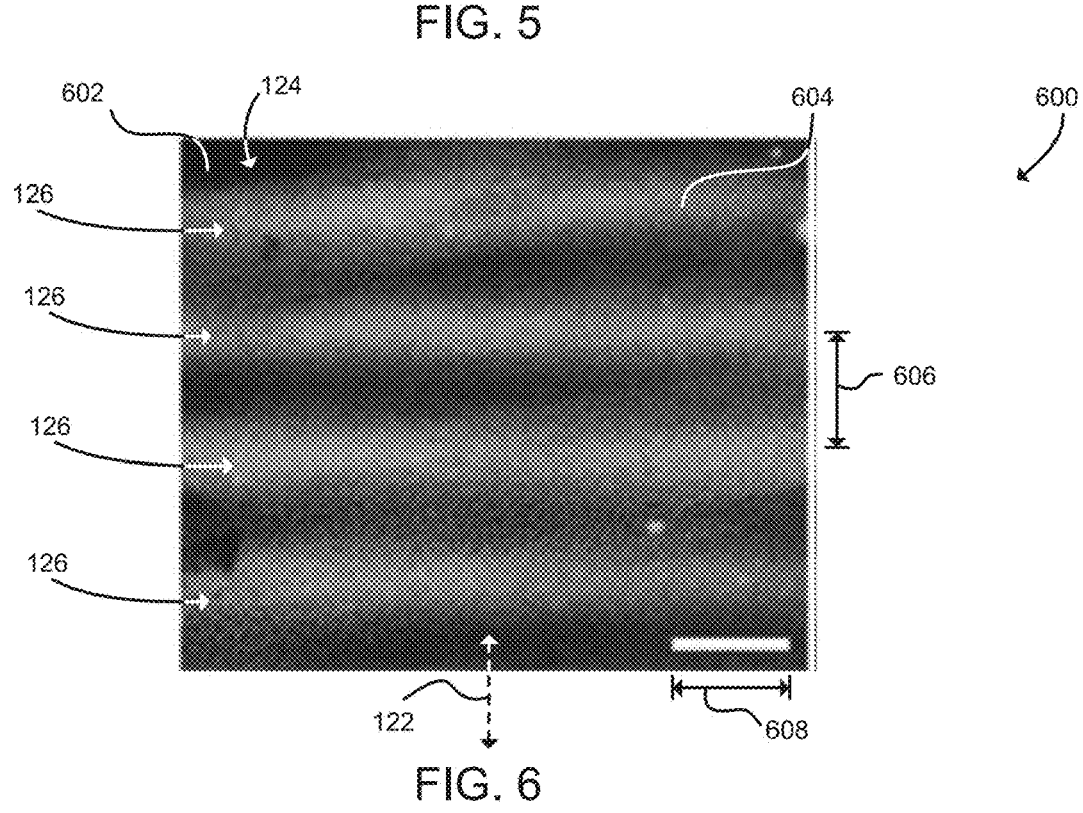
FIG. 6 is an illustration of experimental results that may be achieved for one-dimensional manipulation of nanoparticles using any of the systems of FIG. 1-3 and the method of FIG. 4.

Referring now to FIG. 6, diagram 600 illustrates one possible embodiment of a macroscopic material including a nanotexture fabricated by the system 100. The diagram 600 shows a magnified view of a PDMS film 602 having a nanotexture of 100 nm polystyrene beads 604 that were fabricated using the system 100. In particular, the beads 604 were manipulated using a one-dimensional standing acoustic wave 122 generated by one or more IDTs 104 in a piezoelectric substrate 102 (not shown). The acoustic wave 122 generated a varying electric field 124 that includes antinodes 126 (corresponding to displacement antinodes 126 of the acoustic wave 122). The beads 604 were attracted to the antinodes 126 to form the patterned lines shown in FIG. 6 and then were transferred to the PDMS film 602. As shown, each antinode 126 (and thus each line of beads 604) is separated by a distance 606, which is one-half of the wavelength of the acoustic wave 122. A scale bar 608 corresponds to 60 μm in the illustrative embodiment.

Although illustrated as a macroscopic nanotexture of 100 nm polystyrene beads 604 on a PDMS film 602, such macroscopic nanotextures may be fabricated from other materials. For example, a pattern with aligned carbon nanotubes may be fabricated on a PDMS film. As another example, a pattern with bovine serum albumin proteins (BSA, 66 kDA ~3.5 nm) may be fabricated on hydrogel, and a pattern with dextran (3 kDa, ~1.4 nm) may be fabricated on hydrogel.

Figure 7:
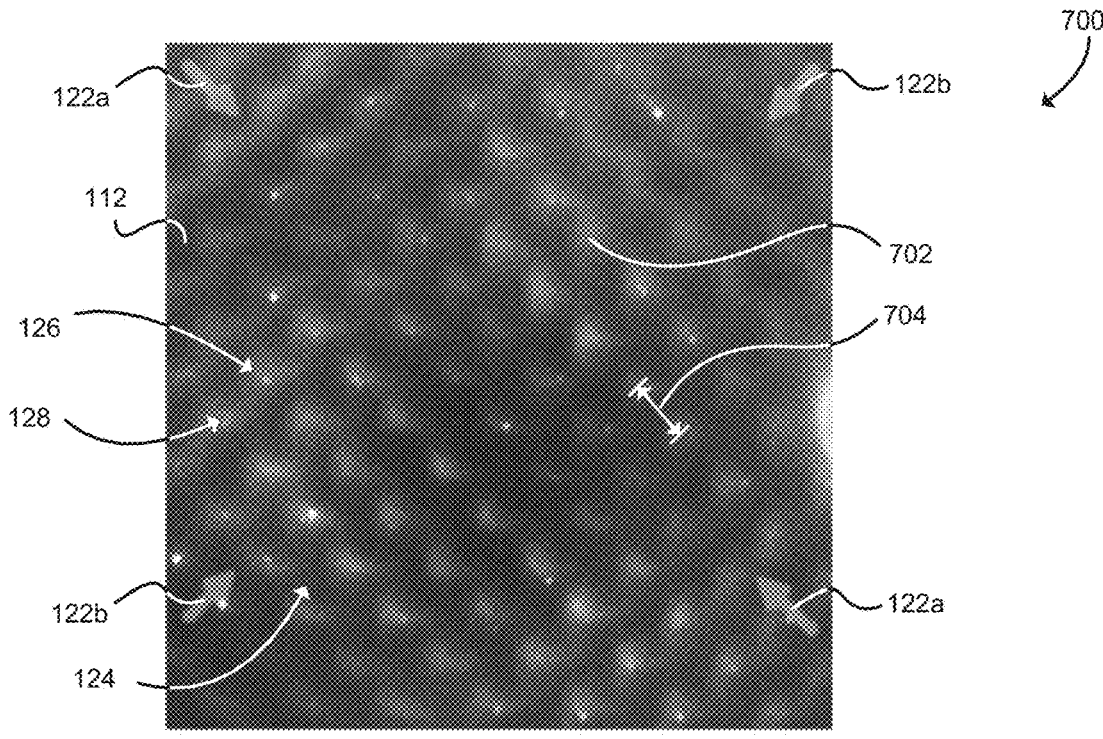
FIG. 7 is an illustration of experimental results that may be achieved for two-dimensional manipulation of nanoparticles using any of the systems of FIG. 1-3 and the method of FIG. 4.

Referring now to FIG. 7, diagram 700 illustrates one possible embodiment of nanoparticle manipulation using two-dimensional acoustic wave superposition that may be performed using the system 100. The diagram 700 shows a two-dimensional pattern of nanoparticles 702 (which are illustratively 100 nm polystyrene beads) distributed on the surface 112 of the piezoelectric substrate 102. In the illustrative embodiment, two orthogonal standing waves 122a, 122b are applied to the piezoelectric substrate 102, generating the varying electric field 124. In the illustrative embodiment, each of the acoustic waves 122a, 122b has the same frequency (e.g., a frequency f). As shown, superposition of the acoustic waves 122a, 122b generates a dot array pattern of antinodes 126 and nodes 128. Illustratively, the trapping positions of the nanoparticles 702 are aligned to both the antinodes 126 and the nodes 128. Each of the antinodes 126 and the nodes 128 is separated by a distance 704, which is one-half of the wavelength of the acoustic waves 122a, 122b.

Figure 8:
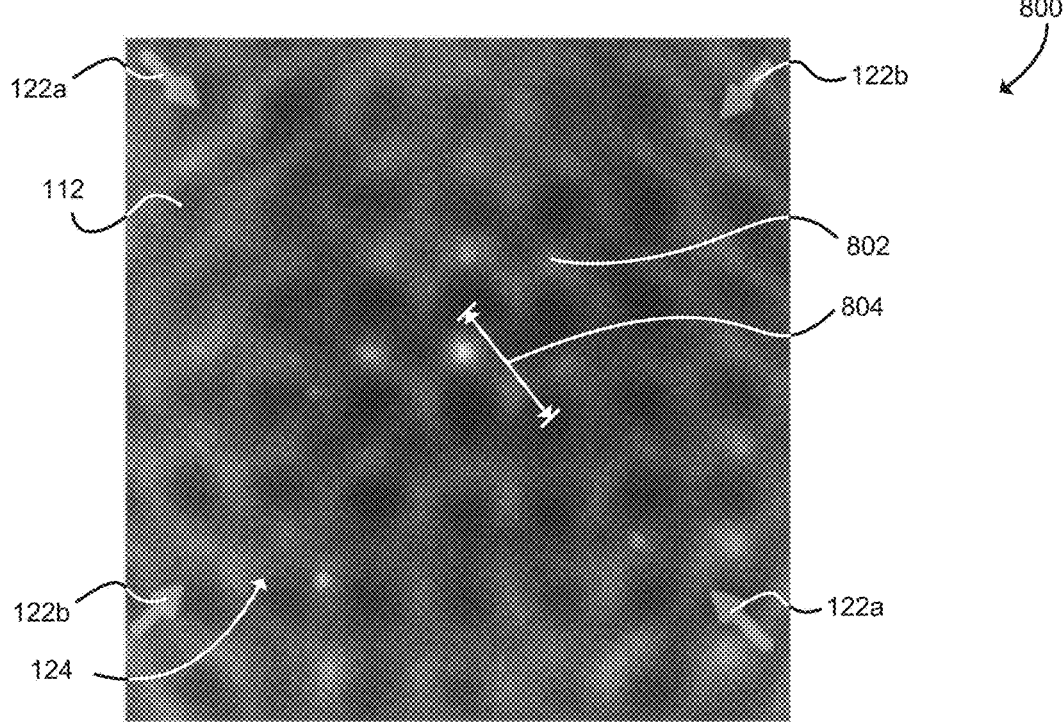
FIG. 8 is an illustration of additional experimental results that may be achieved for two-dimensional manipulation of nanoparticles using any of the systems of FIG. 1-3 and the method of FIG. 4.

Referring now to FIG. 8, diagram 800 illustrates another possible embodiment of nanoparticle manipulation using two-dimensional acoustic wave superposition that may be performed using the system 100. The diagram 800 shows a two-dimensional pattern of nanoparticles 802 (which are illustratively 100 nm polystyrene beads) distributed on the surface 112 of the piezoelectric substrate 102. In the illustrative embodiment, two orthogonal standing waves 122a, 122b are applied to the piezoelectric substrate 102, generating the varying electric field 124. In the illustrative embodiment of FIG. 8, each of the acoustic waves 122a, 122b has a different frequency (e.g., two different frequencies $f_1$ and $f_2$). In some embodiments, the frequencies of the acoustic waves 122a, 122b may be separated by a small amount (e.g., $f_1 = f_2 + \Delta f$). As shown, rather than the dot array pattern of FIG. 7, superposition of the acoustic waves 122a, 122b shown in FIG. 8 generates a network-like pattern of nanoparticles 802. Empty parts of the network-like pattern are separated by the distance 804, which is one-half of the wavelength of the acoustic waves 122a, 122b.

Figure 9:
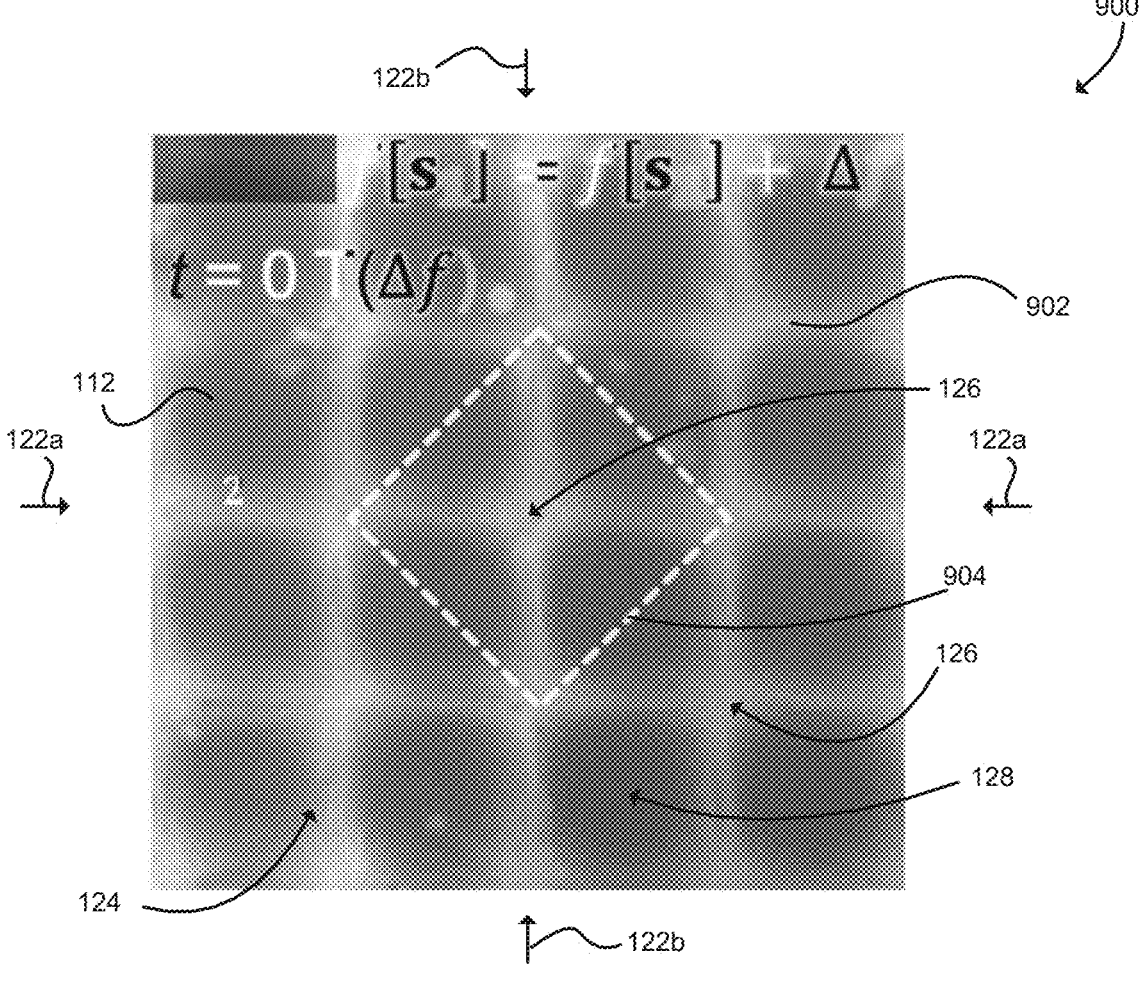
FIG. 9 is an illustration of experimental results that may be achieved for two-dimensional manipulation of carbon nanotubes using any of the systems of FIG. 1-3 and the method of FIG. 4.

Referring now to FIG. 9, diagram 900 illustrates another possible embodiment of nanoparticle manipulation using two-dimensional acoustic wave superposition that may be performed using the system 100. The diagram 900 shows a two-dimensional pattern of carbon nanotubes 902 distributed on the surface 112 of the piezoelectric substrate 102. In the illustrative embodiment, two orthogonal standing waves 122a, 122b are applied to the piezoelectric substrate 102, generating the varying electric field 124. In the illustrative embodiment of FIG. 9, each of the acoustic waves 122a, 122b has a different frequency that is separated by a small amount (e.g., $f_1 = f_2 + \Delta f$). As shown, the carbon nanotubes 902 form a square-shaped array around the displacement nodes 128 with the antinodes 126 positioned at the corners of the square shaped array. The dashed line 904 illustrates the contour of zero potential for the varying electric field 124. The pattern shown in FIG. 9 may be generated due to a temporal periodicity of $\Delta f$ in the long term, causing the antinodes 126 of the varying electric field with opposite transient charges (e.g., + and −) to shift positions.

In some embodiments, the carbon nanotubes 902 may be instantly transitioned between different patterns by changing the frequencies $f_1$ and $f_2$ of the standing waves 122a, 122b. For example, when the frequencies $f_1$ and $f_2$ are equal, the carbon nanotubes 902 are arranged in a network pattern similar to that shown in FIG. 8. In that network pattern, the carbon nanotubes 902 are aligned and patterned toward the displacement antinodes 126 with opposite transient charges across the displacement nodes 128. By tuning the frequencies of the standing waves 122a, 122b such that $f_1=f_2+\Delta f$, where $\Delta f$ is small, the carbon nanotubes 902 transition to the square array pattern shown in FIG. 9.

Figure 10:
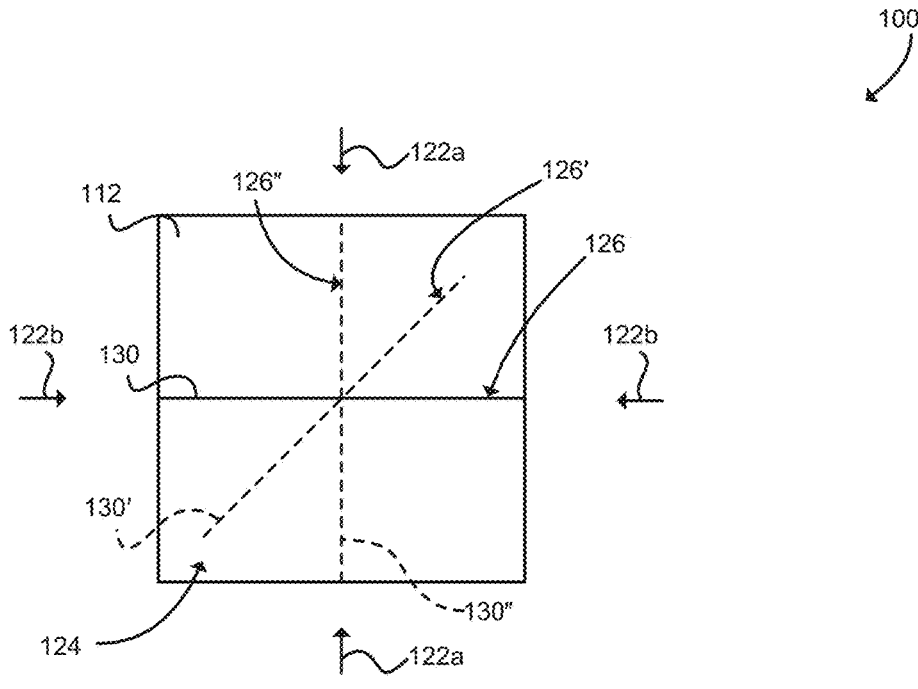
FIG. 10 is a schematic diagram illustrating orthogonal wave manipulation of nanoparticles using any of the systems of FIG. 1-3 and the method of FIG. 4.

Referring now to FIG. 10, schematic diagram 1000 illustrates another possible embodiment of two-dimensional manipulation of nanoparticles using superposition of acoustic waves. The diagram 1000 shows a two-dimensional pattern of nanoparticles 130 distributed on the surface 112 of the piezoelectric substrate 102. Illustratively two standing waves 122a, 122b are superimposed to generate a varying electric field 124. Each of the standing waves 122a, 122b has the same frequency, and the standing waves 122a, 122b are arranged orthogonally with respect to each other. Varying the amplitude of each standing wave 122a, 122b over time may allow for manipulation of the nanoparticles 130 by changing the orientation of the nanoparticles 130, which may be useful for manipulating elongated nanomaterials.

For example, in an initial state the acoustic wave 122a may have a scaled amplitude of 1 (e.g., full on), and the acoustic wave 122b may have a scaled amplitude of 0 (e.g., full off). In that initial state, the nanoparticles 130 may form a linear pattern along a single antinode 126 as shown in FIG. 10. As shown, the nanoparticles 130 are orientated along the wavefront of the acoustic wave 122a, at a horizontal angle of 0° as shown in FIG. 10. The nanoparticles 130 may be an elongated material such as carbon nanotubes. Over time, the amplitudes of the acoustic waves 122a, 122b may be scaled, which causes the orientation of the nanoparticles 130 to rotate. For example, when both the acoustic waves 122a, 122b are full on, the varying electric field 124 may form an antinode 126'. In that state, the nanoparticles 130' form a linear pattern along the antinode 126' and are oriented at a horizontal angle of 45° as shown in FIG. 10. Continuing that example, when the acoustic wave 122a is full off and the acoustic wave 122b is full on, the varying electric field 124 may form an antinode 126". In that state, the nanoparticles 130" form a linear pattern along the antinode 126" and are oriented at a horizontal angle of 90° as shown in FIG. 10. Thus, amplitudes of the acoustic waves 122a, 122b may be modulated to manipulate the orientation of the nanoparticles 130.

Figure 11:
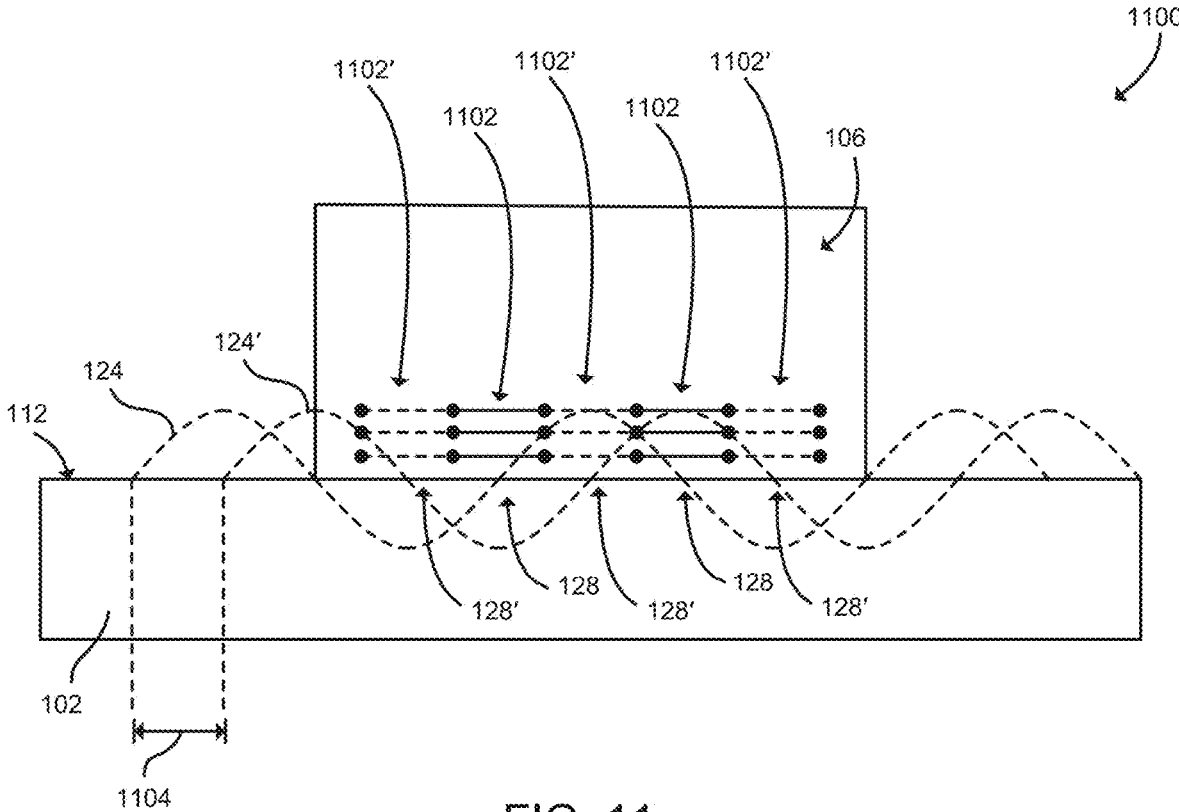
FIG. 11 is a schematic diagram illustrating a nanofabrication technique that may be performed using any of the systems of FIG. 1-3 and the method of FIG. 4.

Referring now to FIG. 11, schematic diagram 1100 illustrates one potential embodiment of manufacturing complex features using overlaid patterned nanomaterials. As a first step, graphene nanoflakes 1102 (30-40 nm, 5-7 atomic layers thick) are patterned by a one-dimensional varying electric field 124 with high excitation amplitude. As shown, the graphene nanoflakes 1102 are positioned over the displacement nodes 128. Such high excitation amplitude ensures the graphene nanoflakes 1102 firmly adhere to the surface 112 of the piezoelectric substrate 102 (or other surface) and will not be disturbed by subsequent acoustoelectronic fields or background flows. As a next step, additional graphene nanoflakes 1102' are injected to the fluid layer 106. The nanoflakes 1102' are patterned with a varying electric field 124', which is phase-shifted from the varying field 124 by a distance

1104, which is illustratively one-quarter of the wavelength of the acoustoelectronic field. The nanoflakes 1102' are positioned over the displacement nodes 128', which creates a thin, interconnected sheet of graphene nanoflakes with one-dimensional connectivity. Of course, in other embodiments a large variety of useful patterns or networks may be fabricated by pattern-overlaying and simultaneously tuning tonal parameters of the excitation signal.

Figure 12:
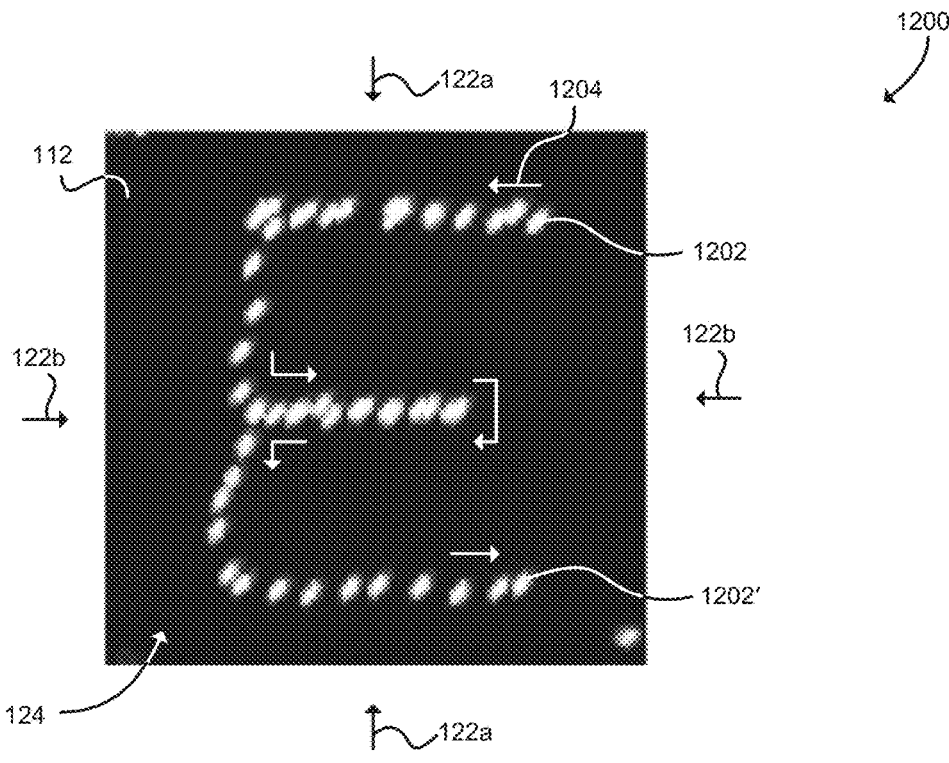
FIG. 12 is an illustration of experimental results that may be achieved for pre-programmed two-dimensional manipulation of a nanoparticle using any of the systems of FIG. 1-3 and the method of FIG. 4.

Referring now to FIG. 12, diagram 1200 illustrates one possible embodiment of two-dimensional manipulation of nanoparticles by varying tonal parameters of acoustic waves. The diagram 1200 is a stacked fluorescence image of a nanoparticle 1202 (illustratively a 400 nm polystyrene bead) on the surface 112 of the piezoelectric substrate 102. Illustratively two standing waves 122a, 122b are superimposed to generate a varying electric field 124. Each of the standing waves 122a, 122b has the same frequency, and the standing waves 122a, 122b are arranged orthogonally with respect to each other. Such 400 nm nanoparticles 1202 can be patterned into a dot array using two-dimensional acoustoelectronic manipulation, for example as discussed above in connection with FIG. 7. A portion of the trapping wells contain single particles 1202. Those particles 1202 can be manipulated by tuning the phases of the acoustic waves 122a, 122b. For example, as shown in FIG. 12, the particle 1202 may be translated in a programmable manner along a complex path illustrated by the arrow 1204 by manipulating the phases of the acoustic waves 122a, 122b.

In some embodiments, manipulating phase of the acoustic wave 122 may be used for sample enhancement or enrichment. For example, in an embodiment a fluid flow including nanoparticles 130 may flow parallel to the antinodes 126 (or nodes 128) of a one-dimensional varying electric field 124. The phase of the field 124 may be continuously swept in a direction perpendicular to the fluid flow. In that example, the nanoparticles 130 may be trapped by the antinodes 126 and swept toward the edges of the fluid layer 106 until reaching the edge. In that example, the nanoparticles 130 may be continually enriched toward the edge of the fluid layer 106. In some embodiments, a wall or other boundary at the edge of the fluid layer 106 may include a groove to receive the nanoparticles 130.

Figure 13:
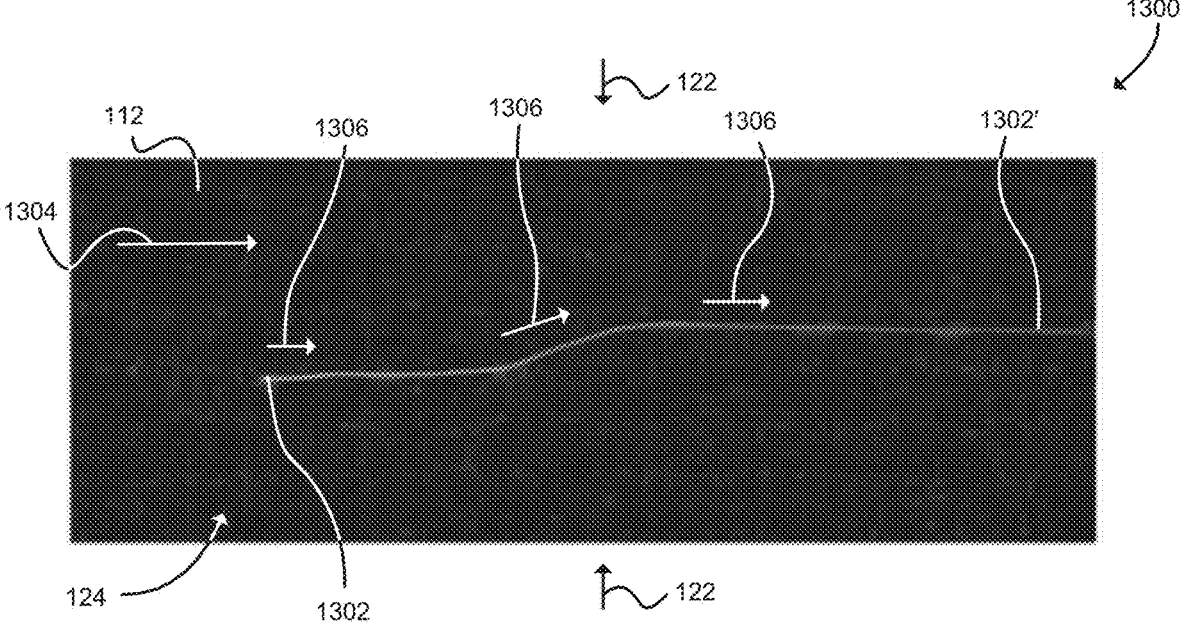
FIG. 13 is an illustration of experimental results that may be achieved for flow sorting nanoparticles using any of the systems of FIG. 1-3 and the method of FIG. 4.

Referring now to FIG. 13, diagram 1300 illustrates one possible embodiment of selectively actuating single nanoparticles in a nano-sorter configuration using the system 100. The diagram 1300 is a stacked fluorescence image of a nanoparticle 1302 (illustratively a 110 nm particle) on the surface 112 of the piezoelectric substrate 102. Illustratively, a standing acoustoelectronic wave 122 generate a varying electric field 124. The acoustoelectronic wave 122 may be a narrow wave generated by reducing the aperture of the IDTs, for example down to about 1.67 times the wavelength of the standing acoustoelectronic waves 122. The nanoparticle 1302 is carried through the fluid layer 106 by a flow 1304 until it reaches a final position 1302'. As the nanoparticle 1302 moves through the fluid layer 106, the varying electric field 124 exerts force on the nanoparticle 1302, causing the nanoparticle to deflect as shown by the arrows 1306. In the illustrative embodiment, the 110 nm particle was deflected by 16 μm. Of course, in other embodiments, the system 100 may sort different nanoparticles 1402. For example, in an embodiment, a 400 nm particle was sorted with a deflection distance of 29 μm, and in another embodiment an exosome was deflected with a deflection distance of 11 μm.

Figure 14:
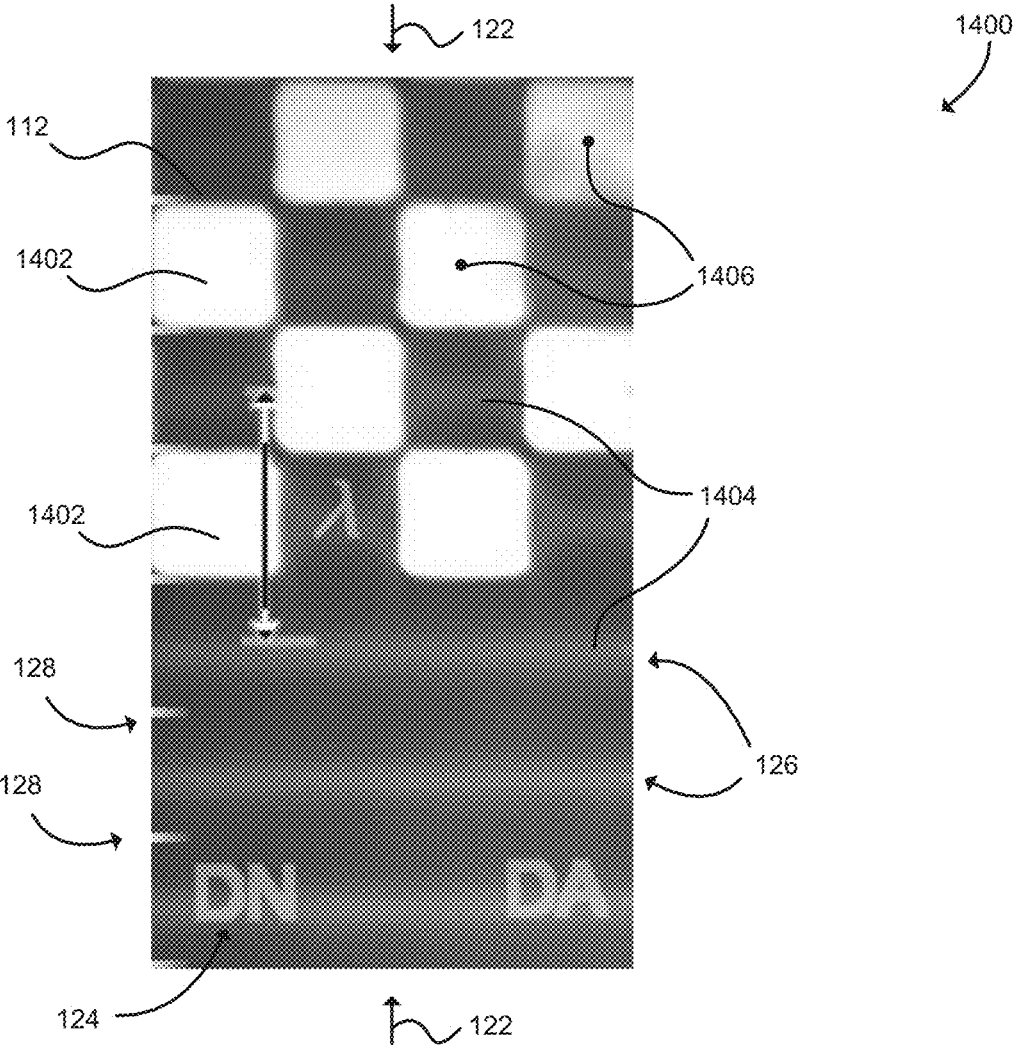
FIG. 14 is an illustration of experimental results that may be achieved for patterning nanoparticles by manipulating electrical parameters of the substrate using any of the systems of FIG. 1-3 and the method of FIG. 4.

Referring now to FIG. 14, diagram 1400 illustrates one potential embodiment of patterning nanoparticles by modifying electrical properties of the piezoelectric substrate 102.

The diagram 1400 shows the surface 112 of the piezoelectric substrate 102. An acoustoelectronic standing wave 122 generates a varying electric field 124. As shown, the acoustoelectronic wave 122 generates a linear pattern of displacement antinodes 126 and displacement nodes 128. Shielded regions 1402 form a checkerboard pattern over the substrate 102. Each shielded region 1402 has lower electric field strength compared to other unshielded regions of the surface 112. As shown in FIG. 14, nanoparticles 1404 that are attracted to the antinodes 126 (such as carbon nanotubes) are trapped over the antinodes 126 on the unshielded regions, and are not trapped over the shielded regions 1402. As also shown in FIG. 14, nanoparticles 1406 that are attracted to the nodes 128 (such as 100 nm polystyrene beads) are trapped over the center of each shielded region 1402, due to the lower electric field strength. Accordingly, selective shielding of the piezoelectric substrate 102 may be used to generate arbitrary nanopatterns.

The invention claimed is:

1. A method for acoustoelectronic manipulation of nanoparticles, the method comprising:
   introducing nanoparticles into a fluid layer positioned over a first surface of a piezoelectric substrate;
   applying a first signal to a first acoustic transducer set, wherein the first acoustic transducer set is coupled to the first surface of the piezoelectric substrate and spaced apart from the fluid layer; and
   varying a parameter of the first signal after introducing the nanoparticles into the fluid layer.

2. The method of claim 1, wherein applying the first signal to the first acoustic transducer set comprises creating a standing acoustic wave in the piezoelectric substrate, wherein the standing wave is in-plane relative to the first surface of the piezoelectric substrate.

3. The method of claim 1, wherein the first piezoelectric substrate comprises a y-cut, 41 degrees rotated lithium niobate crystal.

4. The method of claim 3, wherein the first signal comprises an alternating current signal having a frequency of about 38.44 MHz.

5. The method of claim 1, wherein varying the parameter of the first signal comprises varying an amplitude, a frequency, or a phase of the first signal.

6. The method of claim 1, further comprising applying a second signal to a second acoustic transducer set, wherein the second acoustic transducer set is coupled to the first surface of the piezoelectric substrate and spaced apart from the fluid layer, and wherein the second acoustic transducer set is oriented orthogonally to the first interdigital transducer set.

7. The method of claim 6, wherein the first signal and the second signal have a first frequency.

8. The method of claim 6, wherein the first signal has a first frequency and the second signal has a second frequency, wherein the first frequency and the second frequency differ by a small amount.

9. The method of claim 6, further comprising varying a second parameter of the second signal after introducing the nanoparticles into the fluid layer.

10. The method of claim 9, wherein:
    varying the parameter of the first signal comprises varying a first phase of the first signal; and varying the second parameter of the second signal comprises varying a second phase of the second signal, wherein the first signal and the second signal have a first frequency.

11. The method of claim 9, wherein:
    varying the parameter of the first signal comprises varying a first amplitude of the first signal; and
    varying the second parameter of the second signal comprises varying a second amplitude of the second signal.

12. The method of claim 1, further comprising electrically shielding part of the piezoelectric substrate while applying the signal to the first acoustic transducer set.

13. The method of claim 1, wherein the nanoparticles have a size between about 1 nm to 100 nm.

14. The method of claim 1, wherein the nanoparticles comprise carbon nanotubes, nanowires, nanofibers, graphene flakes, quantum dots, SERS probes, exosomes, vesicles, DNA, RNA, antibodies, antigens, macromolecules, or proteins.

15. The method of claim 1, further comprising transferring the nanoparticles to a macroscopic surface after applying the first signal.

16. A system for acoustoelectronic manipulation of nanoparticles, the system comprising:
    a piezoelectric substrate having a first surface;
    a first acoustic transducer set coupled to the first surface of the piezoelectric substrate;
    a fluid layer positioned over the first surface of the piezoelectric substrate, wherein the fluid layer is spaced apart from the acoustic transducer set on the first surface; and
    a controller configured to (i) apply a first signal to a first acoustic transducer set and (ii) vary a parameter of the first signal after introduction of nanoparticles into the fluid layer.

17. The system of claim 16, further comprising:
    a second acoustic transducer set coupled to the first surface of the piezoelectric substrate and spaced apart from the fluid layer, wherein the second interdigital transducer set is oriented orthogonally or tilted at a predetermined angle relative to the first interdigital transducer set;
    wherein the controller is further to apply a second signal to the second acoustic transducer set.

18. The system of claim 17, wherein the controller is further to vary a second parameter of the second signal after the introduction of the nanoparticles into the fluid layer.

19. The system of claim 18, wherein:
    to vary the parameter of the first signal comprises to vary a first phase of the first signal, and to vary the second parameter of the second signal comprises to vary a second phase of the second signal, wherein the first signal and the second signal have a first frequency; or
    to vary the parameter of the first signal comprises to vary a first amplitude of the first signal, and to vary the second parameter of the second signal comprises to vary a second amplitude of the second signal.

20. The system of claim 16, further comprising a confined microchannel positioned over the first surface of the piezoelectric substrate, wherein the fluid layer is positioned in the confined microchannel.

* * * * *